United States Patent
Ghoshal (10) Patent No.: US 6,356,147 B1
(45) Date of Patent: Mar. 12, 2002

(54) WIDEBAND DUAL AMPLIFIER CIRCUITS

(75) Inventor: Uttam S. Ghoshal, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/740,435

(22) Filed: Dec. 19, 2000

(51) Int. Cl.$^7$ ................................................ H03F 5/00
(52) U.S. Cl. ........................... 330/3; 330/277; 330/311
(58) Field of Search ............................. 330/3, 277, 311

(56) References Cited

U.S. PATENT DOCUMENTS

| | | |
|---|---|---|
| 4,885,548 A | 12/1989 | Wakimoto et al. |
| 5,041,796 A | 8/1991 | Nambu et al. |
| 5,365,198 A | 11/1994 | Wong |
| 5,650,958 A | 7/1997 | Gallagher et al. |
| 5,764,567 A | 6/1998 | Parkin |
| 5,793,697 A * | 8/1998 | Scheuerlein ........... 365/230.07 |
| 5,801,984 A | 9/1998 | Parkin |
| 5,821,812 A | 10/1998 | Park et al. |
| 5,835,314 A | 11/1998 | Moodera et al. |
| 5,841,692 A | 11/1998 | Gallagher et al. |
| 5,952,692 A * | 9/1999 | Nakazato et al. ............ 257/321 |
| 6,205,073 B1 * | 3/2001 | Naji ........................... 365/209 |
| 6,218,903 B1 * | 4/2001 | Hashimoto et al. ......... 330/277 |

* cited by examiner

*Primary Examiner*—Robert Pascal
*Assistant Examiner*—Henry Choe
(74) *Attorney, Agent, or Firm*—Cardinal Law Group; Casimer K. Salys (57) ABSTRACT

Dual amplifying circuits having a magnetic tunnel junction device and a field effect transistor configured in a complementing set are disclosed herein. In one embodiment, the field effect transistor is operable to control a current level of a current operating signal flowing through the magnetic tunnel junction device. In another embodiment, the magnetic tunnel junction device is operable to control a voltage level of a voltage signal being applied to a gate terminal of the field effect transistor. The gain-bandwidth product of both embodiments is greater than the individual gain-bandwidth products of the individual devices through the elimination of noise contributing resistive type circuit elements.

21 Claims, 7 Drawing Sheets

FET

MTJ

FIG. 6

WIDEBAND DUAL AMPLIFIER CIRCUITS

BACKGROUND OF THE INVENTION

1. Field of the Invention

The present invention generally relates to amplifier circuits providing wideband amplification with minimal noise, and in particular, to amplifier circuits utilizing pairs of functionally complementing devices.

2. Description of the Related Art

A gain-bandwidth product as well as a noise factor of a field effect transistor (hereinafter "FET") limits the FET's ability to amplify low-level voltage input signals over a wide range of frequencies. Additionally, a gain-bandwidth product as well as a noise factor of a magnetic tunnel junction device (hereinafter "MTJ") limits the MTJ's ability to amplify low-level current input signals over a wide range of frequencies.

In radio frequency and microwave circuits, the gain of amplifiers utilizing a FET or MTJ as an active filter can be increased by narrowing the pass band of the FET or MTJ. However, that gain responses are not flat and often have phase discontinuities. Furthermore, the noise performance is poorer when stages are cascaded.

The high frequency electronic industry is therefore continually striving to improve the gain-bandwidth product of amplifying circuits.

SUMMARY OF THE INVENTION

The present invention relates to an amplifier circuit which utilizes duality of devices to provide high gain-bandwidth product.

A FET and MTJ are connected in functional cascade to best utilize the amplification, impedance, noise, and operating mode characteristics of each device. This composite utilizes a synergistic improvement in the gain bandwidth of such cascaded pair. In one form the MTJ input is the load of the FET. In another form, the FET input (gate electrode) is the load of the MTJ. The FET/MTJ composite matches respective desirable impedance characteristics while eliminating the noise introduced by resistors in conventional cascade configurations.

The foregoing forms and other forms, features and advantages of the invention will become further apparent from the following detailed description of the presently preferred embodiments, read in conjunction with the accompanying drawings. The detailed description and drawings are merely illustrative of the invention rather than limiting, the scope of the invention being defined by the appended claims and equivalents thereof.

BRIEF DESCRIPTION OF THE DRAWINGS

FIG. 3a depicts a dual voltage amplifier employing the duality concept of the present invention;

FIG. 3b depicts a dual current amplifier employing the duality concept of the present invention;

FIG. 3d depicts a small signal model for the amplifier in FIG. 3a;

DETAILED DESCRIPTION OF THE PRESENTLY PREFERRED EMBODIMENTS

Two electrical circuits are said to be dual of one another if they obey identical circuit equations, but with the roles of current and voltages interchanged. In general, a dual circuit can be constructed by the parameter/configuration interchanges set forth in TABLE 1.

TABLE 1

| FIRST ELECTICAL CIRCUIT | SECOND ELECTRICAL CIRCUIT |
| --- | --- |
| current I | voltage V |
| electric field E | magnetic field M |
| resistance R | conductance G |
| inductance L | capacitance C |
| charge Q | magnetic flux $\Phi$ |
| open circuit | close circuit |
| series connection | parallel connection |
| node | Mesh |

The semiconductor field-effect transistors and the magnetic tunnel junction behave like active dual elements. The FETs are voltage-controlled, i.e. the voltage at the gates control the channel (output) currents, the gate poses a capacitive impedance, and the differential channel impedance is high—ideally a current source. The MTJs are current-controlled, i.e. current through the control lines controls the output voltages, the control lines poses an inductive impedance, and the differential channel impedance is low—ideally a voltage source.

The important small-signal parameters for the FET and MTJ are listed in TABLE 2.

TABLE 2

| FET | MTJ |
| --- | --- |
| Transconductance $g_m$ | Transresistance $r_m$ |
| Input capacitance $C_i$ | Input inductance $L_i$ |
| GB produce $\omega_v = g_m/C_i$ | GB produce $\omega_v = r_m/L_i$ |
| Voltage gain $A_v = g_m r_m$ | Current gain $A_c = r_m g_c$ |
| Output resistance $r_v = \partial V_{ds} / \partial I_{ds}$ | Output conductance $g_c = \partial V_J / \partial I_J$ |

Figure 2:
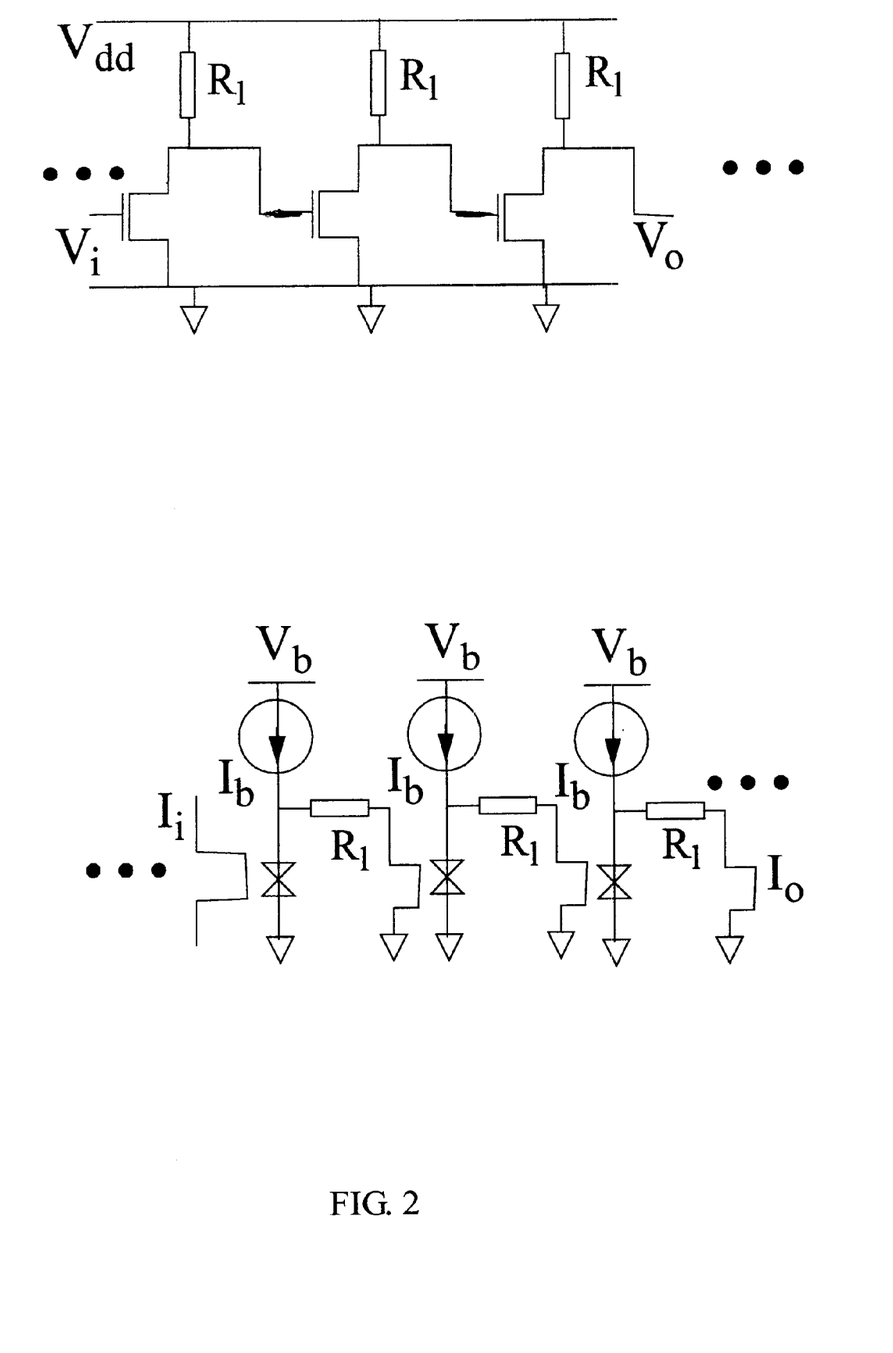
FIG. 2 depicts cascaded FET and MTJ amplifiers.

If one were to cascade individual FET amplifier stages or the MTJ stages as depicted in FIG. 2, one would always have amplifiers with maximum GB product $\omega_v$ or $\omega_c$, and noise characteristics worse than that of individual stage.

Figure 3:
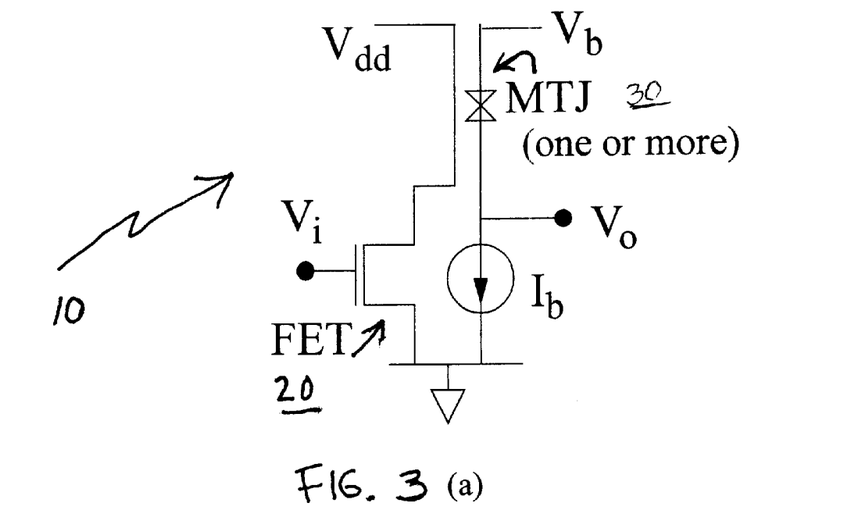

Given a semiconductor FET 20 with GB product $\omega_v$ and a MTJ 30 dual with GB product $\omega_c$, the dual amplifier 10 in FIG. 3a can attain signal gain and power gain for a bandwidth $\omega_h$, which is greater than either $\omega_v$ or $\omega_c$. A unique characteristic of this amplifier 10 is that is has no "load" elements; the dual devices FET 20 and MJT 30 simply transduce voltages to currents and vice versa.

The voltage gain of dual voltage amplifier 10 in FIG. 3a and the current gain of dual current amplifier 40 in FIG. 3b are represented by the following equation (1):

$$A_h = g_m r_m \tag{1}$$

where $g_m$ is the transconductance of FET 20 and $r_m$ is the transresistance of MTJ 30 at the operating point. The FET 20 stage with high output impedance drives the low (inductive) input impedance of the MTJ 30 and the low output impedance of the MTJ 50 drive the high (capacitive) input impedance of the FET 60. This results in the ultra-wide bandwidth response with good gain flatness. If $r_v$ is the small-signal output impedance of the FET (20 or 60), and $g_c$ is the small-signal output conductance of the MTJ (30 or 50), the GB product of the hybrid amplifier (10 or 40) is given by the following equation (2):

$$\omega_h = (g_m r_m)/((L_i/r_v) + (C_i/g_c)) \quad (2)$$

where $L_i$ and $C_i$ are the input inductance of the magnetically coupled MTJ (30 or 50) and the input capacitance of the FET (10 or 40), respectively. Interestingly, $\omega_h$ is independent of the width of the FET (10 or 40) and the length or number of the series-connected MTJs (30 or 50). This is because $g_m$, $C_i$, and $r_v^{-1}$ are proportional to the width of the FET (10 or 40), and $r_m$, $L_i$, and $g_c^{-1}$ are proportional to the length of the MTJ (30 or 50). The dual amplifier (10 or 40) each comprising a FET and a MTJ acts like a single stage with the GB product representing the correct performance measure. By algebraic manipulations, $\omega_h$ can be expressed in terms of the (maximum possible) voltage gain of the FET ($A_v = g_m r_v$) and the (maximum possible) current gain of the magnetically coupled MTJ ($A_c = r_m g_c$), the GB product of the FET ($\omega_v$), and the BF product of the MTJ ($\omega_c$) as represented by the following equation (3):

$$1/\omega_h = (1/A_v \omega_c) + (1/A_c \omega_v) \quad (3)$$

If both $A_v$ and $A_c$ are much larger than unity, it follows that $\omega_h$ is much larger than $\omega_v$ and $\omega_c$. This is a remarkable result since GB product is the more important parameter of a wideband amplifier.

There are three specific reasons why the noise of the dual amplifiers (10 or 40) is low: First, an absence of load resistors, and the Johnson noise associated with the resistors. Second, the individual stages are coupled magnetically. Hence the ground bounce or voltage disturbances in the power supply or ground leads of each individual stage can be isolated and not propagated through the cascaded chain. Finally, the widths of the transistors and the lengths of the MTJ or number of MTJs can be increased without significantly affecting the gain-bandwidth product. Wide transistors or increasing the number of MTJs can reduce both the Johnson noise and the 1/f noise.

Figure 3C:
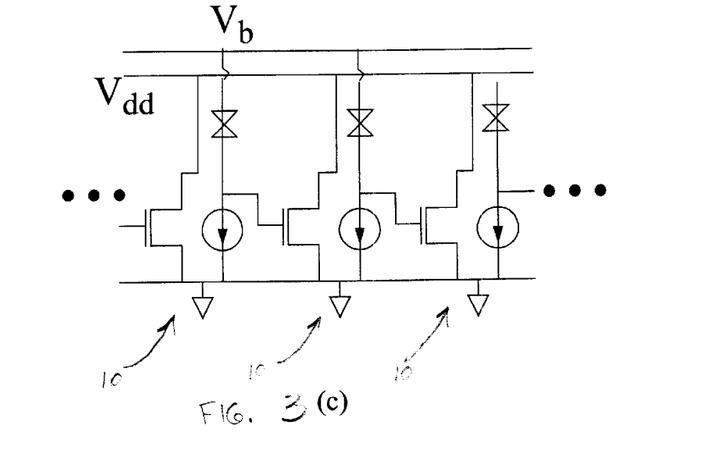
FIG. 3c depicts a cascaded dual voltage amplifier employing the duality concept of the present invention.

FIG. 3c depicts a multiple stage cascaded configuration of dual amplifiers 10 further utilizing the duality concept in each successively connected stage. Thereby, the MTJ output of each dual amplifier stage is connected to the FET input of the successive dual amplifier stage. A corresponding cascade configuration is attainable using dual amplifier 40 as depicted in FIG. 3b.

Figure 1:
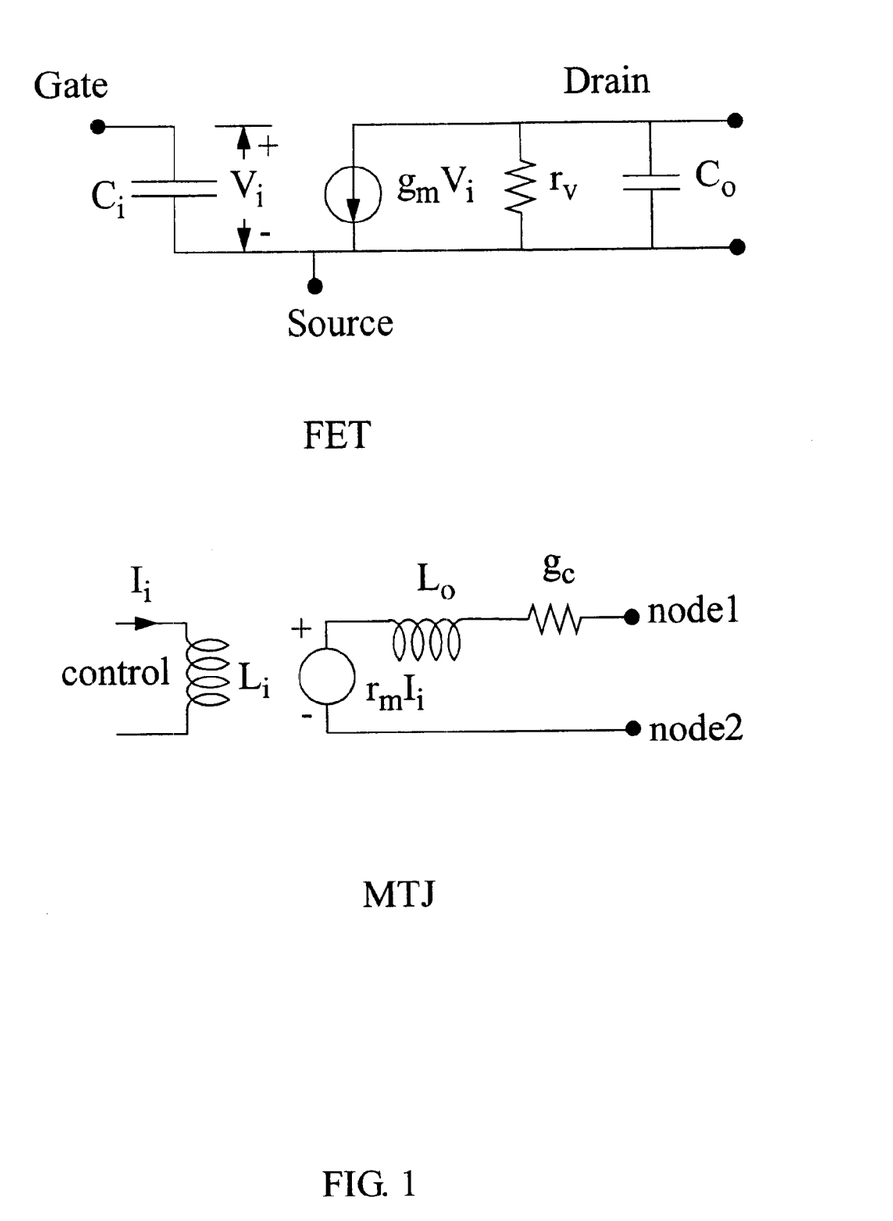
FIG. 1 depicts small signal models of a FET and a MTJ.
Figure 3D:
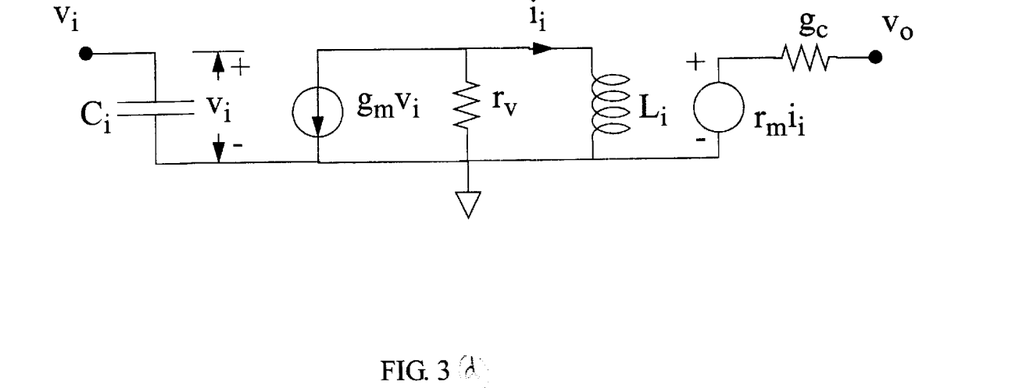

The schematic in FIG. 3d depicts a small signal model for dual amplifier 10 in FIG. 3a. The selective match of device characteristics is readily apparent when compared to the individual FET and MTJ small signal models depicted in FIG. 1.

Figure 4:
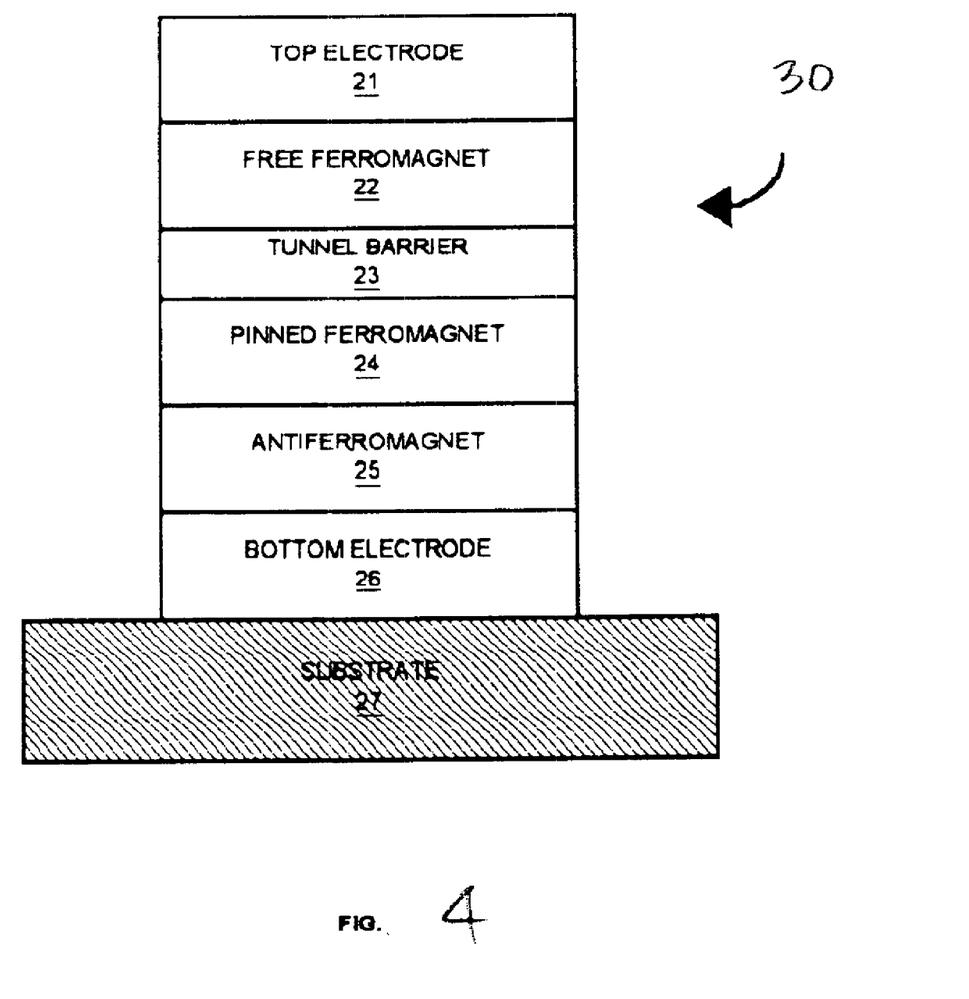
FIG. 4 is a schematic of a MTJ in accordance with the present invention.

Referring to FIG. 4, MTJ 30 is shown in detail. MTJ 30 includes electrode 21, a free ferromagnet 22, a tunnel barrier 23, a pinned ferromagnet 24, an antiferromagnet 25, and electrode 26. Electrode 26, e.g. Ti, Ti/PD or Ta/Pt, formed on a substrate 27, e.g. Si, quartz, N58. Antiferromagnet 25, e.g. MnFe or IrMn, is formed on electrode 26. Pinned ferromagnet 24, e.g. CoFe, or NiFe/CoFe, is formed on antiferromagnet 25. Tunnel barrier 23, e.g. Al$_2$O$_3$, is formed on pinned ferromagnet 24. Free ferromagnet 22, e.g. CoFe/NiFe, is formed on tunnel barrier 23. Electrode 21, e.g. Ti, Ti/PD or Ta/Pt, formed on free ferromagnet 22.

Figure 5:
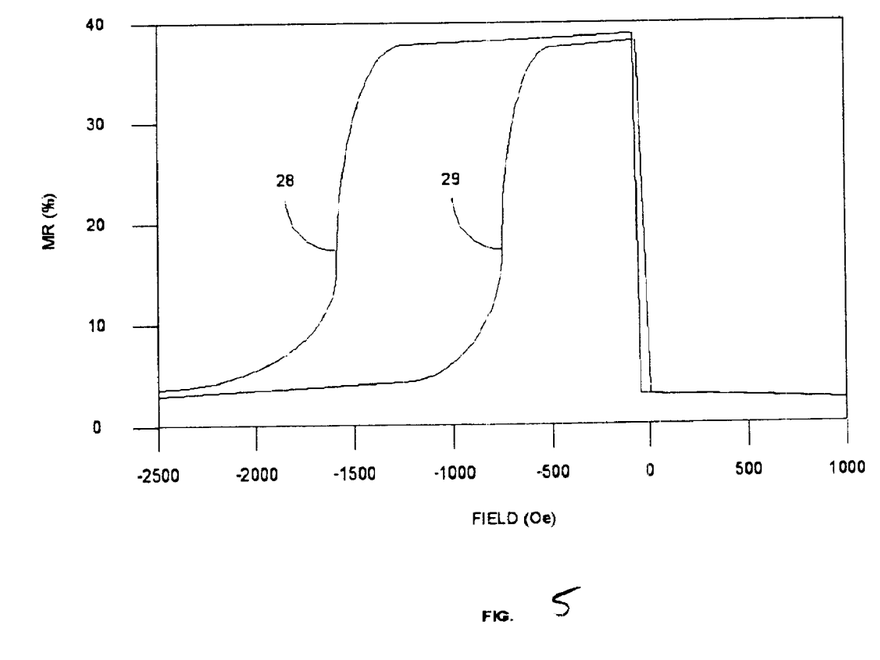
FIG. 5 is a magnetoresistive response curve of the FIG. 4 MTJ.
Figure 6:
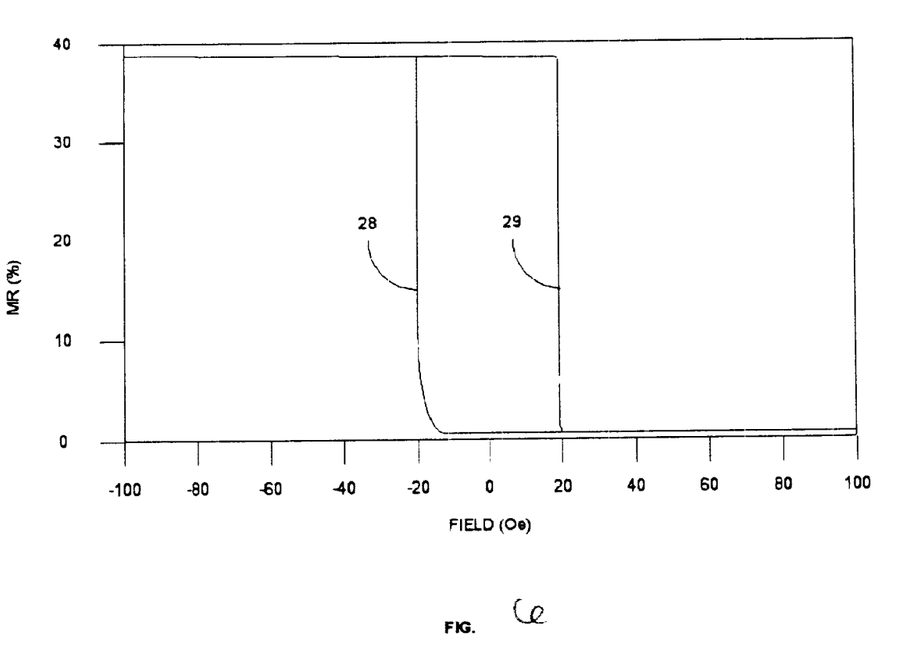
FIG. 6 is a portion of the FIG. 5 magnetoresistive response curve that is applicable to an operation of the FIG. 3a amplifying circuit.

Referring to FIGS. 5 and 6, curves 28 are representative of a change in the magnetoresistance of MTJ 30 as an internal magnetic field decreasing in strength is applied parallel to free ferromagnet 22 and pinned ferromagnet 24. Curves 29 are representative of a change in the magnetoresistance of MTJ 30 as the internal magnetic field of increasing strength is applied parallel to free ferromagnet 22 and pinned ferromagnet 24. Curves 28 and 29 illustrate an approximate 36% change over a range of ±20 Oe. Accordingly, for dual amplifying circuit 10 (FIG. 3a), the current through FET 20 must be maintained in a range of current levels that generates the internal magnetic field over the range of ±20 Oe, and for dual amplifying circuit 40 (FIG. 3b), a current input signal $I_i$ must be maintained in a range of current levels that generates the internal magnetic field over the range of ±20 Oe.

From the description of desirable electronic characteristics attributed to FET 20 in connection with FIGS. 3a and 3b, one skilled in the art will be able to make and use dual amplifying circuits in accordance with the present invention wherein the FETs are replaced by a different type of field effect device. Additionally, from the description of MTJs 30 and 50 in connection with FIGS. 3a and 3b, one skilled in the art will be able to make and use dual amplifying circuits in accordance with the present invention wherein the MTJs are replaced by a different type of active magnet or spintronic device.

While the embodiments of the present invention disclosed herein are presently considered to be preferred, various changes and modifications can be made without departing from the spirit and scope of the invention. The scope of the invention is indicated in the appended claims, and all changes that come within the meaning and range of equivalents are intended to be embraced therein.

I claim:

1. A dual amplifying circuit, comprising:
   a pair of active devices including a field effect device and a magnetic tunnel junction device; and
   an electrical connection of said pair of active devices whereby a load of a first active device of said pair of active devices is a control input to a second active devices of the pair of active devices.

2. The dual amplifying circuit of claim 1, further comprising:
   a current source device connected in an output path of said magnetic tunnel junction device.

3. The dual amplifying circuit of claim 1, further comprising.
   a supply of voltage connected in an output path of said field effect device.

4. The dual amplifying circuit of claim 1, wherein said field effect device is a field effect transistor.

5. The dual amplifying circuit of claim 1, wherein said first active device of said pair of active devices is a field effect transistor; and
   said second active device of said pair of active devices is said magnetic tunnel junction active device.

6. The dual amplifying circuit of claim 1, wherein said first active device of said pair of active devices is said magnetic tunnel effect active device; and
   said second active device of said pair of active devices is a field effect transistor.

7. The dual amplifying circuit of claim 5, wherein a source/drain electrode of said field effect transistor is coupled to drive an input electrode of said magnetic tunnel junction active device.

8. The dual amplifying circuit of claim 6, further comprising:
   a current source, wherein
   an input signal is coupled to a gate electrode of said field effect transistor, and
   an output signal is detected from an electrode coupled between an output electrode of said magnetic tunnel junction active device and said current source.

9. The dual amplifying circuit of claim 6, wherein
   an output electrode of said magnetic tunnel junction active device is coupled to drive a gate electrode of said field effect transistor.

10. The dual amplifying circuit of claim 9, wherein an input signal is coupled to an input electrode of the magnetic tunnel junction active device and the gate electrode of the field effect transistor is coupled between the output electrode of the magnetic tunnel junction active device and a current source.

11. A dual amplifying circuit, comprising:
   a first pair of active devices including a first field effect device and a first magnetic tunnel junction device;
   a first input connected to control a first voltage at a first gate of said first field effect device;
   a first output, from said first field effect device, connected to generate a first control current providing a first magnetic effect within said first magnetic tunnel junction device responsive to said first input; and
   a second output, from said first magnetic tunnel junction device, connected to be responsive to said first input as amplified through the connection of said first field effect device to said first magnetic tunnel junction device.

12. The dual amplifying circuit of claim 11, further comprising:
   a current source device connected in an output path of said first magnetic tunnel junction device.

13. The dual amplifying circuit of claim 11, further comprising:
   a supply of voltage connected to said first output of said first field effect transistor.

14. The dual amplifying circuit of claim 11, wherein:
   a source/drain electrode of said first field effect device is coupled to drive a second input of said first magnetic tunnel junction device.

15. The dual amplifying circuit of claim 11, further comprising:
   a second pair of active devices including a second field effect device and a second magnetic tunnel junction device; and
   a cascade connection of said first pair of active devices to said second pair of active devices to control a second voltage at a second gate of said second field effect device.

16. The dual amplifying circuit of claim 15, further comprising:
   a third output, from said second field effect device, connected to control a second current generating a second magnetic effect within said second magnetic tunnel junction device responsive to said cascade connection; and
   a fourth output, from said second magnetic tunnel junction device, connected to be responsive to said cascade connection as amplified through the connection of said second field effect device to said second magnetic tunnel junction device.

17. A dual amplifying circuit, comprising:
   a first pair of active devices including a first field effect device and a first magnetic tunnel junction device;
   an input connected to generate a first control current providing a first magnetic effect within said first magnetic tunnel junction device;
   a first output, from said first magnetic tunnel junction device, connected to control a first voltage at a first gate of said first field effect device responsive to said input; and
   a second output, from said first field effect device, connected to be responsive to said input as amplified through the connection of said first magnetic tunnel junction device to said first field effect device.

18. The dual amplifying circuit of claim 17, wherein:
   said first output from said first magnetic tunnel junction device is coupled to drive a gate electrode of said field effect device.

19. The dual amplifying circuit of claim 17, further comprising:
   a current source, wherein a gate electrode of said first field effect device is coupled between said current source and said first output from said first magnetic tunnel junction device.

20. The dual amplifying circuit of claim 17, further comprising:
   a second pair of active devices including a second field effect device and a second magnetic tunnel junction device; and
   a cascade connection of said first pair of active devices to said second pair of active device to control a second current generating a second magnetic effect within said second magnetic tunnel junction device.

21. The dual amplifying circuit of claim 20, further comprising:
   a third output, from said second magnetic tunnel junction device, connected to control a second voltage at a second gate of said second field effect device responsive to said cascade connection; and
   a fourth output, from said second field effect device, connected to be responsive to said cascade connection as amplified through the connection of said second magnetic tunnel junction device to said second field effect device.

* * * * *